United States Patent
Yoon et al.

(10) Patent No.: US 10,732,053 B2
(45) Date of Patent: Aug. 4, 2020

(54) APPARATUS FOR MEASURING TEMPERATURE OF POWER DEVICE USING PIEZOELECTRIC DEVICE, APPARATUS FOR REDUCING THERMAL STRESS, AND METHOD FOR MANUFACTURING THE SAME

(71) Applicant: INDUSTRY-UNIVERSITY COOPERATION FOUNDATION HANYANG UNIVERSITY, Seoul (KR)

(72) Inventors: Sang Won Yoon, Seoul (KR); Min Ki Kim, Seoul (KR)

(73) Assignee: Industry-University Cooperation Foundation Hanyang University, Seoul (KR)

(*) Notice: Subject to any disclaimer, the term of this patent is extended or adjusted under 35 U.S.C. 154(b) by 249 days.

(21) Appl. No.: 15/573,568

(22) PCT Filed: May 13, 2016

(86) PCT No.: PCT/KR2016/005107
§ 371 (c)(1),
(2) Date: Nov. 13, 2017

(87) PCT Pub. No.: WO2016/182396
PCT Pub. Date: Nov. 17, 2016

(65) Prior Publication Data
US 2018/0149525 A1 May 31, 2018

(30) Foreign Application Priority Data

May 13, 2015 (KR) .......................... 10-2015-0066819
May 13, 2015 (KR) .......................... 10-2015-0066822

(51) Int. Cl.
*G01K 5/56* (2006.01)
*H01L 41/08* (2006.01)
(Continued)

(52) U.S. Cl.
CPC ................. *G01K 5/56* (2013.01); *G01K 5/72* (2013.01); *G01L 1/16* (2013.01); *H01L 41/0805* (2013.01);
(Continued)

(58) Field of Classification Search
CPC .................................... G01K 5/56; G01L 1/16
See application file for complete search history.

(56) References Cited

U.S. PATENT DOCUMENTS 3,940,974 A * 3/1976 Taylor .................... G01K 7/003
374/177
4,684,884 A * 8/1987 Soderlund .......... G01R 31/2884
324/537
(Continued)

FOREIGN PATENT DOCUMENTS

JP 2009180645 8/2009
JP 2010-520522 A 6/2010
(Continued)

*Primary Examiner* — Lisa M Caputo
*Assistant Examiner* — Philip L Cotey
(74) *Attorney, Agent, or Firm* — Sughrue Mion, PLLC

(57) ABSTRACT

An apparatus for measuring a temperature of a power device using a piezoelectric device according to an exemplary embodiment of the present disclosure includes: a substrate; at least one power device formed on one surface of the substrate; and at least one piezoelectric device disposed on the substrate as spaced from the power device and configured to measure a thermal stress generated on the substrate to sense a temperature caused by heat generation of the power device.

22 Claims, 12 Drawing Sheets

(51) Int. Cl.
*H01L 41/257* (2013.01)
*H01L 41/113* (2006.01)
*G01K 5/72* (2006.01)
*G01L 1/16* (2006.01)

(52) U.S. Cl.
CPC ........ *H01L 41/1132* (2013.01); *H01L 41/257* (2013.01)

(56) References Cited

U.S. PATENT DOCUMENTS

| | | | | |
|---|---|---|---|---|
| 5,834,653 | A * | 11/1998 | Glaser | G01L 1/16 73/774 |
| 6,359,372 | B1 * | 3/2002 | Dujari | H05K 1/0271 310/328 |
| 2002/0130911 | A1 * | 9/2002 | Huang | B41J 2/14137 347/7 |
| 2004/0164753 | A1 * | 8/2004 | Hettori | G01L 9/0054 324/725 |
| 2005/0109587 | A1 * | 5/2005 | Best | D21F 1/0027 198/810.01 |
| 2007/0113665 | A1 * | 5/2007 | Johnson | G01L 9/065 73/721 |
| 2007/0170170 | A1 * | 7/2007 | Sata | H05B 1/0233 219/497 |
| 2008/0011091 | A1 * | 1/2008 | Weldon, Jr. | G01L 1/255 73/766 |
| 2010/0277040 | A1 * | 11/2010 | Klee | B06B 1/0292 310/324 |
| 2010/0301706 | A1 * | 12/2010 | Koury, Jr. | G01L 1/16 310/338 |
| 2012/0267563 | A1 * | 10/2012 | Capsal | H01L 41/183 252/62.9 R |
| 2014/0124158 | A1 * | 5/2014 | Yamashita | F25D 11/006 165/10 |
| 2014/0355647 | A1 * | 12/2014 | Lee | H01L 41/25 374/117 |
| 2015/0340591 | A1 * | 11/2015 | Zhang | H01L 41/18 310/360 |
| 2016/0252406 | A1 * | 9/2016 | Sherrit | E21B 47/065 374/117 |
| 2018/0003569 | A1 * | 1/2018 | Eid | G01K 11/26 |

FOREIGN PATENT DOCUMENTS

| | | |
|---|---|---|
| JP | 2011-527059 A | 10/2011 |
| JP | 2013-503388 A | 1/2013 |
| KR | 10-2015-0008894 A | 1/2015 |

* cited by examiner

APPARATUS FOR MEASURING TEMPERATURE OF POWER DEVICE USING PIEZOELECTRIC DEVICE, APPARATUS FOR REDUCING THERMAL STRESS, AND METHOD FOR MANUFACTURING THE SAME

CROSS-REFERENCE TO RELATED APPLICATION(S)

This application is a National Stage of International Application No. PCT/KR2016/005107, filed on May 13, 2016, which claims the priority benefit of Korean Patent Application No. 10-2015-0066819 filed on May 13, 2015, and Korean Patent Application No. 10-2015-0066822 filed on May 13, 2015, in the Korean Intellectual Property Office, the disclosure of which is incorporated herein by reference for all purposes.

TECHNICAL FIELD

The exemplary embodiments of the present invention relate to an apparatus for measuring a temperature of a power device using a piezoelectric device, an apparatus for reducing a thermal stress, and a method for manufacturing the same.

BACKGROUND ART

A general power (electronic) module is a device configured to control power and functions as a key component in a power electronic system. A power module used in an eco-friendly car recently getting attention, a renewable energy generator, and a new concept power grid such as a smart grid controls high power and thus necessarily results in high power consumption. The power consumption is converted mainly into heat energy which causes a high temperature within the power module.

The high temperature may cause degradation or instability in performance of the power module and also cause damage to or failure of the module. Further, since the high temperature is generated only in a place where power is concentrated, the distribution of heat within the power module is not even. Due to the heat generation problem, it becomes important to measure an accurate temperature and a thermal stress caused by heat generation in the power module. The thermal stress can be measured by measuring distribution of temperature or distribution of stress during heat generation.

However, if a temperature sensor is integrated in a semiconductor to measure a temperature and a thermal stress within the power module, an operation of the semiconductor may be affected or a fine process may be needed, which makes it difficult to perform a sensor process. There are a few cases where a temperature sensor is integrated in a semiconductor. However, in such a case, high processing cost may be incurred and the performance of the semiconductor may be affected, and the semiconductor is necessarily increased in size. Particularly, the effect on the performance of the semiconductor makes it difficult to widely use this method.

Accordingly, there is a need for a technology of measuring distribution of temperature of a power module or a thermal stress generated by heat within a semiconductor.

Meanwhile, the heat generation problem within the power module has become worse recently, and has been accelerating with the advent of high-power systems such as an electric car or a smart grid. Particularly, a thermal stress which is one of phenomena caused by heat of the power module may cause various problems such as destruction of the power module and generation of fatigue. However, a complicated three-dimensional structure of the power module and a composition of different materials including repeated conductor and insulator cannot provide a suitable solution to the thermal stress problem. As such, due to the heat generation problem, it becomes important to measure an accurate temperature and reduce a thermal stress caused by heat generation in the power module.

However, if a temperature sensor is integrated in a semiconductor to measure a temperature and a thermal stress within the power module, an operation of the semiconductor may be affected or a fine process may be needed, which makes it difficult to perform a sensor process. There are a few cases where a temperature sensor is integrated in a semiconductor. However, in such a case, high processing cost may be incurred and the performance of the semiconductor may be affected, and the semiconductor is necessarily increased in size. Further, a technology for reducing a thermal stress in a portion where heat is concentrated according to a measurement result of temperatures and thermal stresses within a power module tends to be developed actively.

Accordingly, there is a need for a technology of indirectly measuring and reducing distribution of temperature of a power module or a thermal stress generated by heat within a semiconductor.

DISCLOSURE

Technical Problem

An exemplary embodiment of the present disclosure provides an apparatus for measuring a temperature of a power device using a piezoelectric device which is capable of indirectly measuring a temperature generated from a power device on a substrate.

An exemplary embodiment of the present disclosure provides an apparatus for reducing a thermal stress of a power device using a piezoelectric device in which the piezoelectric device is disposed on a substrate including the power device as spaced from the power device and configured to operate as at least one of a sensor and an actuator, and, thus, a thermal stress generated on the substrate by heat generation of the power device can be indirectly measured and can be reduced, and a method for manufacturing the same.

However, problems to be solved by the present disclosure are not limited to the above-described problems. Although not described herein, other problems to be solved by the present disclosure can be clearly understood by a person having ordinary skill in the art from the following description.

Technical Solution

An apparatus for measuring a temperature of a power device using a piezoelectric device according to an exemplary embodiment of the present disclosure includes: a substrate; at least one power device formed on one surface of the substrate; and at least one piezoelectric device disposed on the substrate spaced from the power device and configured to measure a thermal stress generated on the substrate to sense a temperature caused by heat generation of the power device.

The at least one piezoelectric device may be disposed as spaced in up and down and left and right directions from the at least one power device.

If the at least one power device is plural in number, the at least one piezoelectric device may be disposed between the power devices.

If the at least one power device is plural in number, the at least one piezoelectric device may be disposed as spaced in the up and down and left and right directions from the power devices except between the power devices.

Among the at least one piezoelectric device, a piezoelectric device disposed at a position intersecting with a layout direction of the power devices may have a length which is set on the basis of a length of each of the power devices and a separation distance between the power devices.

The piezoelectric device may be formed on one surface and the other surface of the substrate and may be disposed in opposition to each other with respect to the substrate.

The apparatus for measuring a temperature of a power device using a piezoelectric device according to an exemplary embodiment of the present disclosure may further include a temperature sensing unit configured to sense a temperature of the power device on the basis of a voltage value of a voltage signal generated from the at least one piezoelectric device by the thermal stress.

If a plurality of voltage values includes noise, the temperature sensing unit may calculate a temperature of the power device and distribution of temperature within a power module in consideration of reduction of the noise.

If the voltage signals are different in polarity, the temperature sensing unit may sense a temperature of the power device and distribution of temperature within a power module on the basis of a difference between voltage values of the voltage signals different from each other in polarity.

If the at least one piezoelectric device is disposed as spaced in up and down and left and right directions from the power devices except between the power devices, the temperature sensing unit may sense a temperature of the power device and distribution of temperature within a power module on the basis of the sum of voltage values of voltage signals generated from a piezoelectric device disposed as spaced in at least one of the up and down or left and right directions from the power devices.

An apparatus for reducing a thermal stress of a power device using a piezoelectric device according to an exemplary embodiment of the present disclosure includes: a substrate; at least one power device formed on an upper surface of the substrate; and at least one piezoelectric device disposed on the substrate spaced from the power device and including an electrode configured to receive an electrical signal from the outside to measure a thermal stress caused by heat generation of the power device or to reduce the thermal stress generated on the substrate.

The piezoelectric device may operate as at least one of a sensor configured to measure the thermal stress generated on the substrate to sense a temperature caused by heat generation of the power device or an actuator configured to receive the electrical signal through the electrode to reduce the thermal stress.

The piezoelectric device may receive an electrical signal having an opposite polarity to that of an electric signal generated when the thermal stress is generated through the electrode and thus reduce the thermal stress generated on the substrate.

The electrode may include: an upper electrode formed on an upper surface of the piezoelectric device; and a lower electrode formed on a lower surface of the piezoelectric device.

The substrate may be a power substrate including an upper metal layer and a lower metal layer on an upper surface and a lower surface, respectively, of an insulator, and the lower electrode may be the upper metal layer of the power substrate.

The electrode may be disposed on both ends of the piezoelectric device in a longitudinal direction.

If the piezoelectric device is disposed as spaced in all directions from the power device, the electrode may be disposed at both ends of a first piezoelectric device disposed in opposition thereto in one direction among the piezoelectric devices and an upper electrode and a lower electrode may be disposed on an upper surface and a lower surface, respectively, of a second piezoelectric device disposed in the other direction intersecting with the one direction.

The apparatus for reducing a thermal stress of a power device using a piezoelectric device according to an exemplary embodiment of the present disclosure may further include a power supply unit configured to supply the electrical signal to the electrode, and if the thermal stress is generated on the substrate, the power supply unit may supply the electrode with an electrical signal having an opposite polarity to that of an electric signal generated when the thermal stress is generated.

The piezoelectric device may be disposed as spaced in all directions from the power device.

The apparatus for reducing a thermal stress of a power device using a piezoelectric device according to an exemplary embodiment of the present disclosure may further include a temperature sensing unit configured to sense a temperature of the power device on the basis of an electrical signal generated from the piezoelectric device when the thermal stress is generated.

A method for manufacturing an apparatus for reducing a thermal stress of a power device using a piezoelectric device according to an exemplary embodiment of the present disclosure includes: providing a substrate; forming at least one power device on an upper surface of the substrate; and forming at least one piezoelectric device including an electrode configured to receive an electrical signal from the outside to reduce a thermal stress generated on the substrate by heat generation of the power device, on the substrate spaced from the power device, and the forming of at least one piezoelectric device includes forming an upper electrode and a lower electrode on an upper surface and a lower surface, respectively, of the piezoelectric device through a poling process.

The providing of a substrate includes providing a power substrate including an upper metal layer and a lower metal layer on an upper surface and a lower surface, respectively, of an insulator, and the lower electrode may be the upper metal layer of the power substrate.

Details of other exemplary embodiments will be included in the detailed description and the accompanying drawings.

Advantageous Effects

According to an exemplary embodiment of the present disclosure, it is possible to indirectly measure a thermal stress and a temperature generated from a power device on a substrate.

According to an exemplary embodiment of the present disclosure, it is not necessary to measure a temperature by directly attaching a sensor to the power device as before, and a piezoelectric device is disposed as spaced from the power device to indirectly measure a temperature of the power device. Therefore, it is possible to minimize heat transfer from the power device to the piezoelectric device and thus possible to minimize an effect on an operation of the power device while accurately measuring a temperature of the power device.

According to an exemplary embodiment of the present disclosure, the piezoelectric device is integrated on the substrate and thus can be unified with the substrate. Also, it is possible to suppress the complexity of a process and the increase in cost.

According to an exemplary embodiment of the present disclosure, the piezoelectric device is disposed on the substrate including the power device as spaced from the power device and configured to operate as at least one of a sensor and an actuator. Thus, it is possible to indirectly measure a thermal stress generated on the substrate by heat generation of the power device and also possible to reduce the thermal stress generated on the substrate.

According to an exemplary embodiment of the present disclosure, when the piezoelectric device operates as an actuator to attenuate a stress in a portion of the substrate where the thermal stress is concentrated. Thus, it is possible to reduce thermal deformation of the substrate and also possible to suppress thermal damage to the substrate.

According to an exemplary embodiment of the present disclosure, the piezoelectric which can operate as both a sensor and an actuator is integrated on the substrate. Thus, it is possible to implement an apparatus for reducing a thermal stress of a power device with a minimum change in design.

BEST MODE

Figure 1:
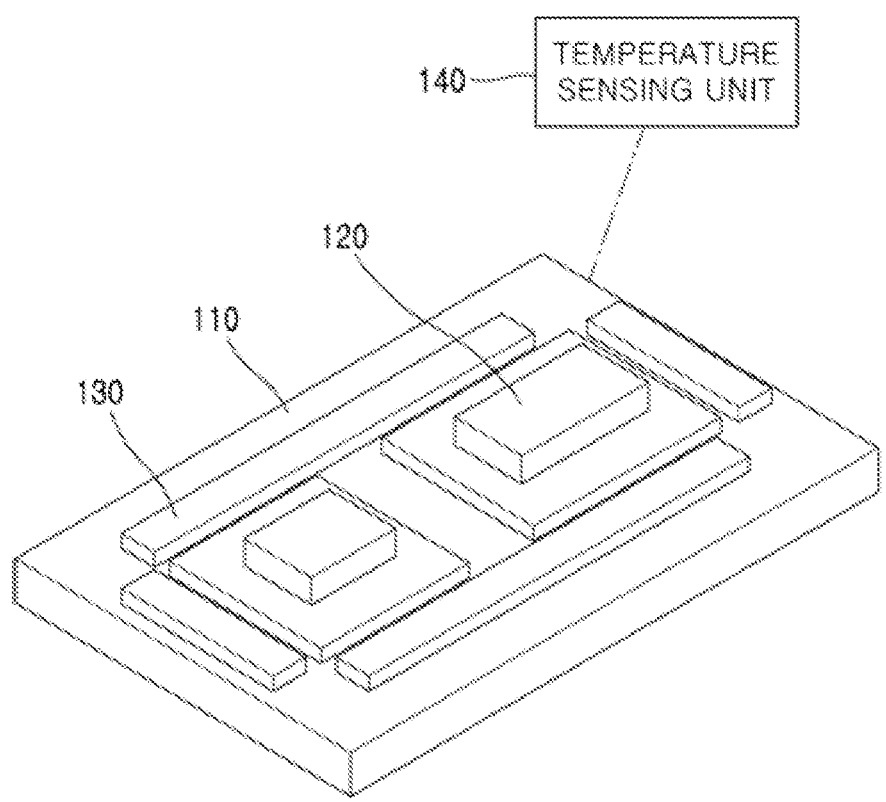
FIG. 1 is a diagram provided to explain an apparatus for measuring a temperature of a power device using a piezoelectric device according to an exemplary embodiment of the present disclosure.

The advantages and/or features of the present disclosure, and methods for accomplishing the same will be more clearly understood from exemplary embodiments described below with reference to the accompanying drawings. However, the present disclosure is not limited to the following exemplary embodiments but may be implemented in various different forms. The exemplary embodiments are provided only to complete disclosure of the present disclosure and to fully provide a person having ordinary skill in the art to which the present disclosure pertains with the category of the invention, and the present disclosure will be defined by the appended claims. Like reference numerals generally denote like elements throughout the present specification.

Hereinafter, exemplary embodiments of the present disclosure will be described in detail with reference to the accompanying drawings.

Figure 2:
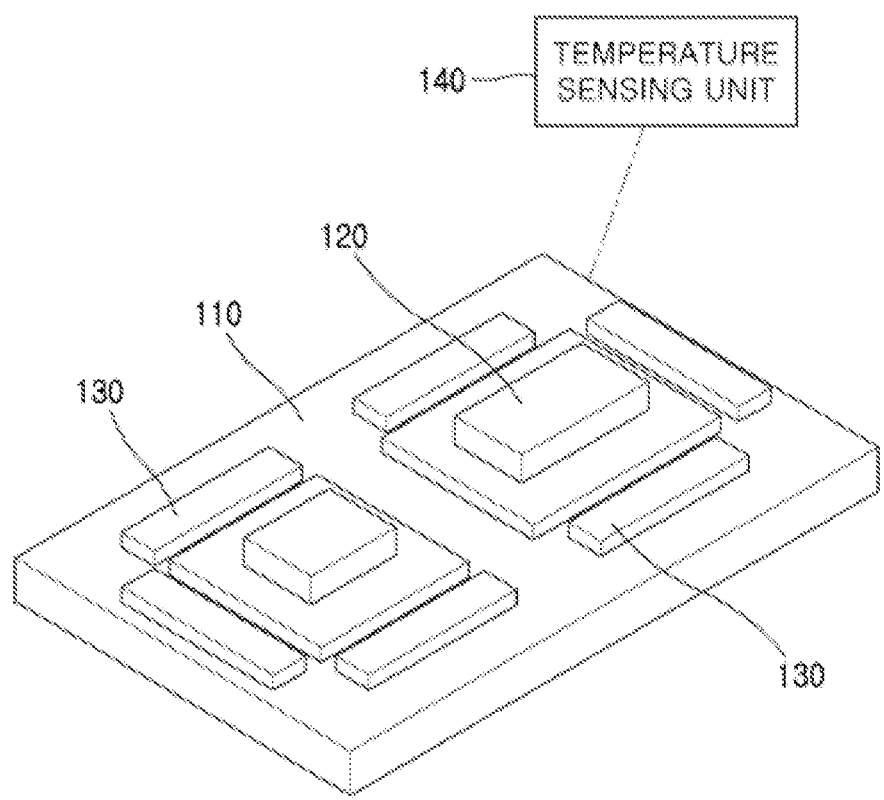
FIG. 2 is a diagram illustrating a modification example of the apparatus for measuring a temperature of a power device using a piezoelectric device according to an exemplary embodiment of the present disclosure.

FIG. 1 is a diagram provided to explain an apparatus for measuring a temperature of a power device using a piezoelectric device according to an exemplary embodiment of the present disclosure, and FIG. 2 is a diagram illustrating a modification example of the apparatus for measuring a temperature of a power device using a piezoelectric device according to an exemplary embodiment of the present disclosure.

Firstly, referring to FIG. 1, an apparatus 100 for measuring a temperature of a power device using a piezoelectric device according to an exemplary embodiment of the present disclosure may include a substrate 110, a power device 120, a piezoelectric device 130, and a temperature sensing unit 140.

The substrate 110 may be formed to have a rectangular parallelepiped shape, and the power device 120 and the piezoelectric device 130 may be provided on one surface of the substrate 110.

The substrate 110 may be implemented using a material suitable to increase thermal conductivity, for example, a ceramic material using one of $Al_2O_3$, AlN, and SiN. For reference, in the present exemplary embodiment, it is preferable to implement the substrate 110 with AlN having a piezoelectric property.

The substrate 110 may be implemented as a power substrate having a structure in which a ceramic substrate formed of the ceramic material is sandwiched between two metal plates. For example, the substrate 110 may be implemented as a power substrate including metal plates and an insulator such as AlN interposed therebetween. For reference, the piezoelectric device 130 may be directly provided on the insulator or may be provided on one surface of the metal plate.

Meanwhile, the substrate 110 can be bent by heat generated from the power device 120. That is, if heat is generated when the power device 120 operates, the substrate 110 can be bent by the heat due to a big difference in thermal expansion coefficient between the substrate 110 and the power device 120.

At least one power device 120 is formed on one surface of the substrate 110. In this case, if there is a plurality of power devices 120, the plurality of power devices 120 may be disposed as spaced at a predetermined distance from each other on the substrate 110.

Further, the power device 120 may be formed on one surface of the substrate 110. For example, if the substrate 110 is implemented as the power substrate, the power device 120 may be formed on one surface of the metal plate.

In this case, if the power device 120 generates heat, the substrate 110 can be bent due to a big difference in thermal expansion coefficient between the power device 120 and the metal plate of the substrate 110 and between the metal plate and the insulator of the substrate 110.

At least one piezoelectric device 130 is disposed on the substrate 110 spaced from the power device 120. In the following description, the piezoelectric device 130 will be described as plural in number.

The piezoelectric devices 130 may be disposed as spaced in up and down and left and right directions from the power device 120.

As illustrated in FIG. 1, it is assumed that two power devices 120 are provided on one surface of the substrate 110.

In this case, a total of seven piezoelectric devices 130 can be disposed on one surface of the substrate 110 as spaced up and down and left and right directions from the two power devices 120. That is, the seven piezoelectric devices 130 may be disposed surrounding the circumference of each of the two power devices 120.

Further, at least one piezoelectric device 130 may be disposed between the power devices 120. That is, each of the piezoelectric devices 130 may be disposed between the power devices 120, or a plurality of piezoelectric devices 130 may be disposed between the power devices 120.

Hereinafter, a modification example of the piezoelectric device 130 will be described with reference to FIG. 2. Herein, the piezoelectric device 130 will be described as plural in number.

As illustrated in FIG. 2, if there is a plurality of power devices 120, the piezoelectric devices 130 may be disposed as spaced in the up and down and left and right directions except between the power devices 120.

That is, if two power devices 120 are provided on one surface of the substrate 110, a total of six piezoelectric devices 130 may be disposed on the one surface of the substrate 110 as spaced in up and down and left and right directions from each of the two power devices 120 except between the two power devices 120.

In other words, two of the six piezoelectric devices 130 may be disposed in opposition to each other with respect to the power devices 120 in a layout direction of the power devices 120, and the other four piezoelectric devices 130 may be disposed in opposition to each other with respect to the power devices 120 in a direction intersecting with the layout direction of the power devices 120.

In this case, the other four piezoelectric devices 130 may have a length which is set on the basis of a length of each of the power devices 120 and a separation distance between the power devices 120.

That is, the length of the other four piezoelectric devices 130 may be set on the basis of a length of each of the metal plates disposed on the lower surfaces of the two power devices 120 except the separation distance between the power devices 120.

The piezoelectric devices 130 measure a thermal stress generated on the substrate 110 to sense a temperature caused by heat generation of the power devices 120.

In this case, if the substrate 110 is bent by heat generated from the power devices 120, the piezoelectric devices 130 formed on the substrate 110 may also be bent.

That is, the piezoelectric devices 130 generate a voltage signal depending on the degree of bending and can measure a stress using the generated voltage signal.

To this end, the piezoelectric devices 130 may be disposed as spaced from the power devices 120, i.e., around the power devices 120.

In other words, the piezoelectric devices 130 are disposed as spaced at a predetermined distance from the power devices 120 and thus can indirectly measure a thermal stress generated on the substrate 110 when the power devices 120 generate heat.

Thus, according to an exemplary embodiment of the present disclosure, the piezoelectric devices 130 can measure not heat generated from the power devices 120 but a stress generated on the substrate 110 by the heat. Therefore, according to an exemplary embodiment of the present disclosure, it is not necessary to measure a temperature by directly attaching a sensor to the power device 120 as before, and the piezoelectric devices 130 are disposed as spaced around the power devices 120. Therefore, it is possible to minimize heat transfer from the power devices 120 to the piezoelectric devices 130 and thus possible to more accurately measure a temperature of the power devices 120.

If a thermal stress is generated on the substrate 110 by heat generation of the power devices 120, the temperature sensing unit 140 can sense a temperature of the power devices 120 on the basis of a voltage value of a voltage signal generated from the at least one piezoelectric device 130 by the thermal stress.

Figure 3:
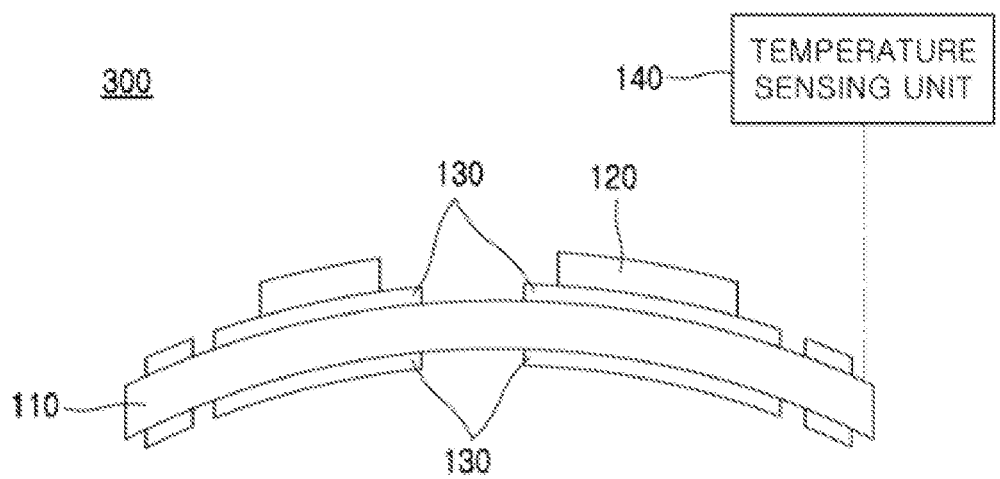
FIG. 3 is a diagram provided to explain an apparatus for measuring a temperature of a power device using a piezoelectric device according to another exemplary embodiment of the present disclosure.
Figure 4:
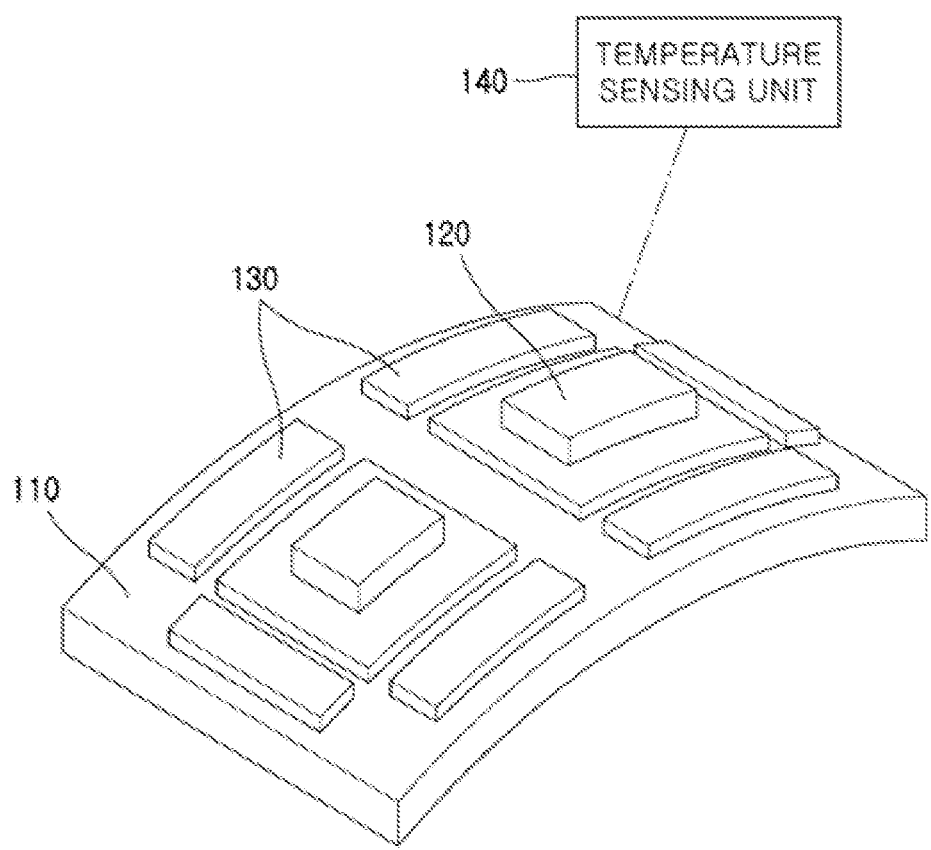
FIG. 4 is a diagram provided to explain calculation of a temperature of a power device in consideration of reduction of noise according to an exemplary embodiment of the present disclosure.

For example, if heat is not generated from the power devices 120, the substrate 110 is flat as illustrated in FIG. 1 and FIG. 2, and if heat is generated from the power devices 120, the substrate 110 and the piezoelectric devices 130 can be bent as illustrated in FIG. 3 and FIG. 4 and thus the piezoelectric devices 130 can generate the voltage signal.

Herein, the characteristics of the piezoelectric devices 130 are already wieldy known. Therefore, an explanation thereof will be omitted in an exemplary embodiment of the present disclosure.

Meanwhile, if a plurality of voltage values includes noise, the temperature sensing unit 140 may calculate a temperature of the power devices 120 in consideration of reduction of the noise.

The calculation of a temperature of the power devices 120 in consideration of reduction of the noise will be described when exemplary embodiments of FIG. 3 and FIG. 4 are explained.

FIG. 3 is a diagram provided to explain an apparatus for measuring a temperature of a power device using a piezoelectric device according to another exemplary embodiment of the present disclosure.

Referring to FIG. 3, an apparatus 300 for measuring a temperature of a power device using a piezoelectric device according to another exemplary embodiment of the present disclosure may include the substrate 110, the power device 120, the piezoelectric device 130, and the temperature sensing unit 140.

Prior to explanation of the present exemplary embodiment, an explanation of the substrate 110 and the power device 120 will be omitted in the present exemplary embodiment and only the piezoelectric device 130 and the temperature sensing unit 140 will be described in detail since the substrate 110 and the power device 120 have the structures and characteristics identical or similar to those of the substrate 110 and the power device 120, respectively, illustrated in FIG. 1 and FIG. 2.

The piezoelectric devices 130 are formed on one surface and the other surface of the substrate 110 and may be disposed in opposition to each other with respect to the substrate 110. That is, the piezoelectric devices 130 may be disposed at corresponding positions with the substrate 110 interposed therebetween.

For example, if two power devices 120 are provided on one surface of the substrate 110 as illustrated in FIG. 3, six piezoelectric devices 130 may be provided on each of the one surface and the other surface of the substrate 110.

In this case, when the power devices 120 operate, a thermal stress is generated on the substrate 110 by heat generation of the power devices 120. Therefore, the six piezoelectric devices 130 formed on the one surface of the substrate 110 may generate a voltage signal having a positive (+) polarity and the six piezoelectric devices 130 formed on the other surface of the substrate 110 may generate a voltage signal having a negative (−) polarity.

That is, the piezoelectric devices 130 may generate voltage signals different from each other in polarity when a thermal stress is generated on the substrate 110.

The temperature sensing unit 140 may sense a temperature of the power devices 120 on the basis of a difference between voltage values of the voltage signals different from each other in polarity.

To this end, the temperature sensing unit 140 includes a conversion table (not illustrated) in which temperatures respectively matched with a plurality of voltage values are stored, and may sense a temperature of the power devices 120 using the conversion table.

That is, the temperature sensing unit 140 may calculate a difference between voltage values of voltage signals generated from the piezoelectric devices 130 disposed in opposition to each other with respect to the substrate 110 and search a value corresponding to the calculated voltage value difference from the conversion table and acquire a temperature value matched therewith and thus sense a temperature of the power devices 120.

Meanwhile, a voltage signal generated from the piezoelectric devices 130 may include noise. In this case, the temperature sensing unit 140 may calculate a temperature of the power devices 120 in consideration of the noise included in the voltage signal.

Specifically, it is assumed that the piezoelectric device 130 formed on one surface (upper surface) of the substrate 110 generates a voltage value of S1+N1 (S1: voltage signal, N1: noise) and the piezoelectric device 130 formed on the other surface (lower surface) of the substrate 110 generates a voltage value of −S1+N2 (−S1: voltage signal, N2: noise).

In this case, the temperature sensing unit 140 may deduct the voltage value of −S1+N2 from the voltage value of S1+N1 and thus calculate a voltage value 2S1+N1−N2 from which the noise is reduced (or removed), and may search the calculated voltage value 2S1+N1−N2 from the conversion table and acquire a temperature value matched therewith and thus sense a temperature of the power devices 120.

FIG. 4 is a diagram provided to explain calculation of a temperature of a power device in consideration of reduction of noise according to an exemplary embodiment of the present disclosure. For reference, FIG. 4 illustrates a state where the substrate of the apparatus for measuring a temperature of a power device as illustrated in FIG. 3 is bent by heat generation of the power device and thus a thermal stress is generated.

As illustrated in FIG. 4, if two power devices 120 are provided on one surface of the substrate 110, a total of six piezoelectric devices 130 can be disposed as spaced up and down and left and right directions from the two power devices 120 except between the two power devices 120. In this case, each of the six piezoelectric devices 130 can generate a voltage signal depending on a thermal stress generated on the substrate caused by heat generation of the power devices 120.

The temperature sensing unit 140 may sum up voltage values of voltage signals generated from the respective piezoelectric devices 130 and sense a temperature of the power devices 120 on the basis of the sum of the voltage values. To this end, the temperature sensing unit 140 may use the conversion table as described with reference to FIG. 3.

In this case, the voltage signals may include noise. Therefore, the temperature sensing unit 140 may sense a temperature of the power devices 120 in consideration of the noise included in the voltage signals.

For example, it is assumed that the voltage signals including noise have voltage values of S1+N1 (S1: voltage signal, N1: noise) and S1+N2 (S1: voltage signal, N2: noise).

In this case, the temperature sensing unit 140 may deduct the voltage value S1+N2 from the voltage value S1+N1 and halve a value N1−N2 as a result of the deduction and then deduct the halved value from the previously measured voltage value S1+N1 and thus calculate a value (S1+N1)−(N1−N2)/2 from which a part of the noise is reduced. This process can also be applied to the voltage value S1+N2.

Therefore, in an exemplary embodiment of the present disclosure, when a temperature of the power devices 120 is sensed, a noise corresponding to a difference between the voltage values including the noise value is halved and then deducted from the voltage value including the noise value. Thus, a part of the noise can be reduced from the previously measured voltage value.

Thus, the temperature sensing unit 140 can reduce weight of the noise value in the previously measured voltage value by deducting the halved noise from the voltage value including the noise value and thus more accurately sense a temperature of the power devices 120.

As such, according to an exemplary embodiment of the present disclosure, when the power devices 120 operate, the piezoelectric devices 130 operate in response to a thermal stress generated on the substrate 110 as spaced around the power devices 120 and generate the voltages and may function as a sensor for measuring a temperature of the power devices 120 on the basis of the voltages.

Therefore, according to an exemplary embodiment of the present disclosure, a thermal stress and a temperature generated from the power devices 120 on the substrate 110 can be indirectly measured through the piezoelectric devices 130.

Further, according to an exemplary embodiment of the present disclosure, it is not necessary to measure a temperature by directly attaching a sensor to the power device as before, and the piezoelectric devices are disposed as spaced around the power devices to measure a temperature of the power devices. Therefore, it is possible to minimize heat transfer from the power devices to the piezoelectric devices and thus possible to more accurately measure a temperature of the power devices.

Furthermore, according to an exemplary embodiment of the present disclosure, the piezoelectric devices are integrated on the substrate. Therefore, it is possible to unify the piezoelectric devices with the substrate and also possible to suppress the complexity of a process and the increase in cost.

Figure 5:
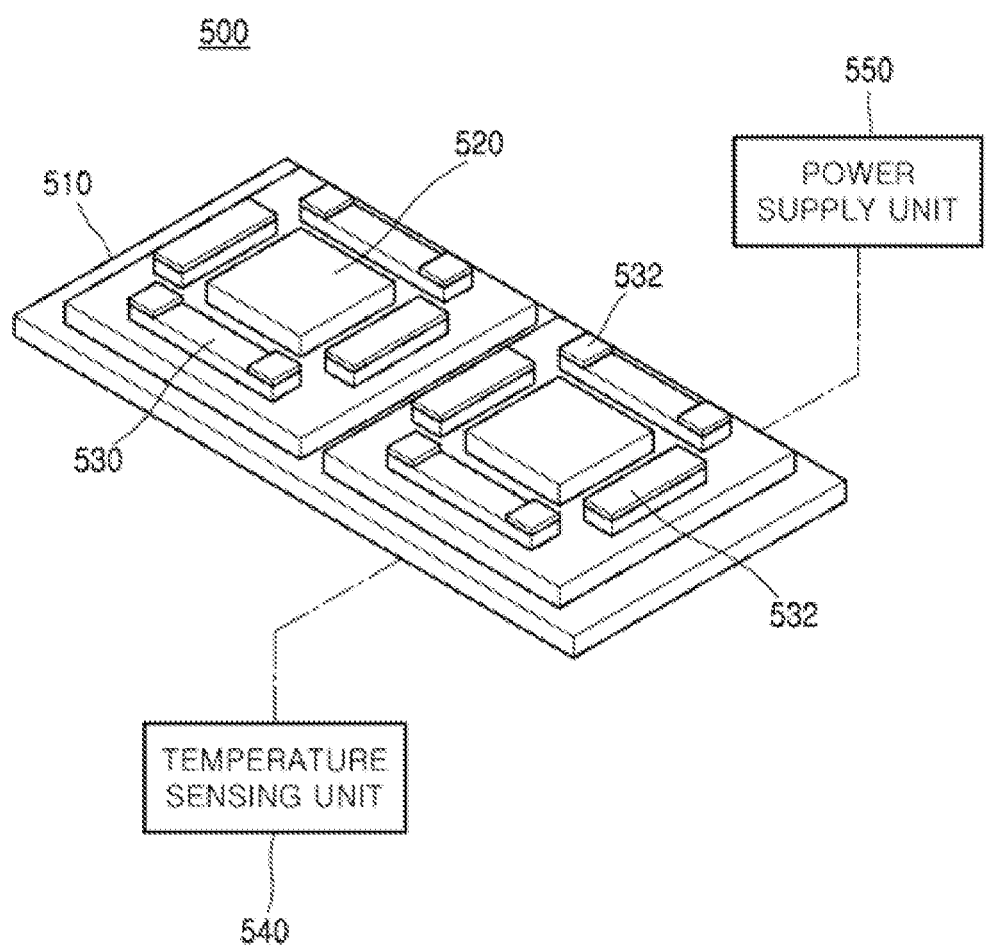
FIG. 5 is a diagram provided to explain an apparatus for reducing a thermal stress of a power device using a piezoelectric device according to an exemplary embodiment of the present disclosure.
Figure 6:
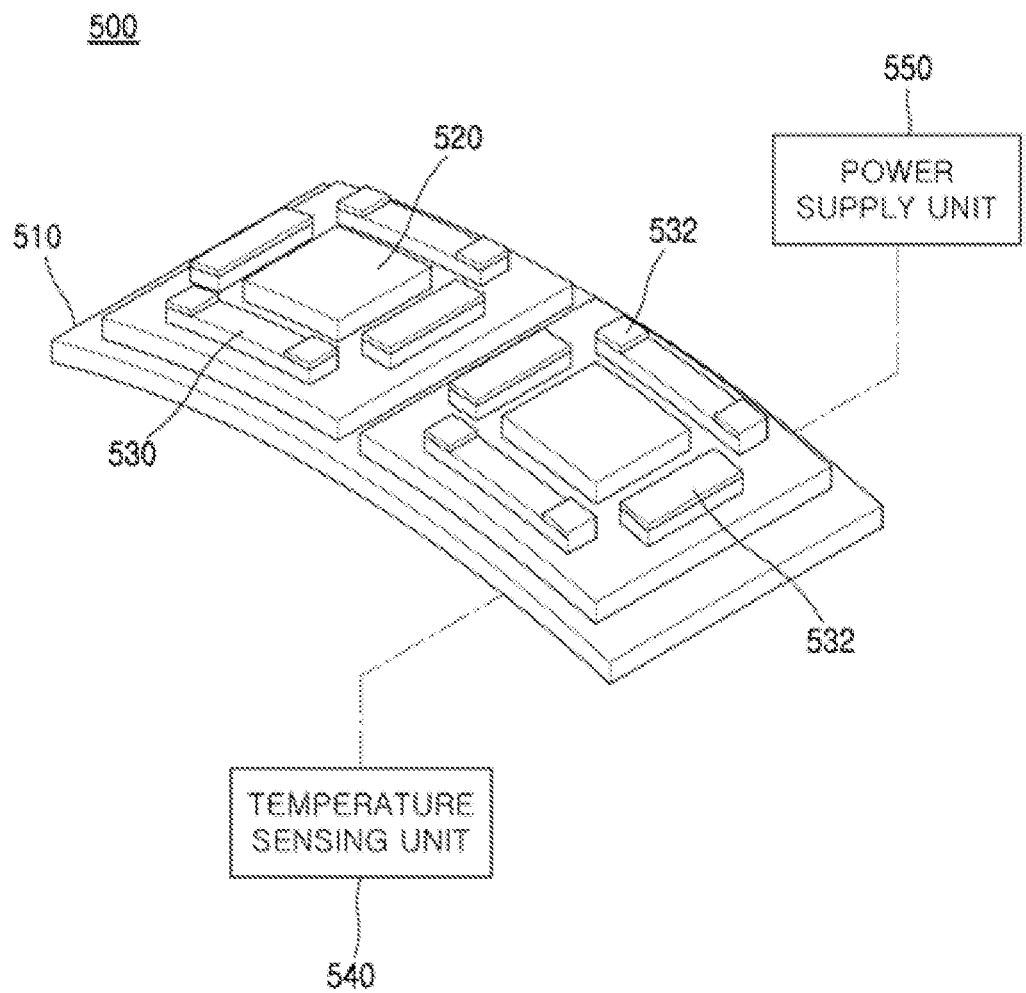
FIG. 6 is a diagram provided to explain a function of a piezoelectric device as an actuator in the apparatus for reducing a thermal stress of a power device using a piezoelectric device according to an exemplary embodiment of the present disclosure.

FIG. 5 is a diagram provided to explain an apparatus for reducing a thermal stress of a power device using a piezoelectric device according to an exemplary embodiment of the present disclosure, and FIG. 6 is a diagram provided to explain a function of a piezoelectric device as an actuator in the apparatus for reducing a thermal stress of a power device using a piezoelectric device according to an exemplary embodiment of the present disclosure.

Referring to FIG. 5 and FIG. 6, an apparatus 500 for reducing a thermal stress of a power device using a piezoelectric device according to an exemplary embodiment of the present disclosure may include a substrate 510, a power device 520, a piezoelectric device 530, a temperature sensing unit 540, and a power supply unit 550.

The substrate 510 may be formed as a plate having a rectangular parallelepiped shape, and the power device 520 and the piezoelectric device 530 may be provided on one surface of the substrate 510.

The substrate 510 may be implemented using a material suitable to increase thermal conductivity, for example, a ceramic material using one of $Al_2O_3$, AlN, and SiN. Herein, $Al_2O_3$ is much cheaper and most generally used.

For reference, in the present exemplary embodiment, it is preferable to implement the substrate 510 with $Al_2O_3$ which is most widely used and cheap.

The substrate 510 may be implemented using ceramic which is an insulator, and may be implemented as a power substrate including an upper metal layer and a lower metal layer on an upper surface and a lower surface, respectively, of the insulator.

That is, the substrate 510 may be implemented as a substrate having a structure in which the ceramic insulator formed of ceramic is sandwiched between the upper metal layer and the lower metal layer. For reference, the upper metal layer and the lower metal layer may be formed of a material having excellent thermal conductivity such as copper and aluminum.

Meanwhile, the substrate 510 can be bent by heat generated from the power device 520. That is, if heat is generated when the power device 520 operates, the substrate 510 can be bent due to a big difference in thermal expansion coefficient between the upper metal layer of the substrate 510 and the power device 520 or between the upper and lower metal layers of the substrate 510 and the insulator.

At least one power device 520 is formed on the upper surface of the substrate 510. In this case, if there is a plurality of power devices 520, the plurality of power devices 520 may be disposed as spaced at a predetermined distance from each other on the substrate 510.

If the substrate 510 is implemented as the power substrate, the power device 510 may be formed on the upper metal layer of the insulator. Thus, heat generated from the power device 520 may be transferred to the upper metal layer and then transferred to the substrate 510.

That is, the power device 520 generates heat when it is operated, and the generated heat may be transferred to the substrate 510 through the upper metal layer functioning as a medium for transferring the heat between the power device 520 and the substrate 510. In this case, the power device 520 and the upper metal layer of the substrate 510 have a big difference in thermal expansion coefficient and thus have different degrees of expansion by heat. Therefore, a great thermal stress can be generated.

At least one piezoelectric device 530 is disposed on the substrate 510 spaced from the power device 520.

In other words, the piezoelectric device 530 may be disposed as spaced in all directions from the power device 520.

The piezoelectric device 530 includes an electrode 532 configured to receive an electrical signal from the outside to reduce a thermal stress by generating a reversed stress on the substrate 510 when the power device 520 generates heat.

That is, the piezoelectric device 530 can operate as an actuator configured to receive the electrical signal through the electrode 532 to reduce the thermal stress.

Further, the piezoelectric device 530 can operate as a sensor configured to measure a thermal stress generated on the substrate 510 to sense a temperature caused by heat generation of the power device 520.

That is, the piezoelectric device 530 can generate an electrical signal having a voltage value corresponding to a measurement value of the thermal stress generated on the substrate 510.

As such, the piezoelectric device 530 can operate as at least one of the sensor or the actuator.

According to an exemplary embodiment of the present disclosure, the piezoelectric device 530 is processed using the same piezoelectric material to be used as the sensor and the actuator and thus can be applied to a complicated three-dimensional power module structure, such as a bidirectional cooling structure, which needs to be uniform in vertical height.

If the piezoelectric device 530 operates as the sensor, the temperature sensing unit 540 may sense a temperature of the power device 520 on the basis of an electrical signal generated from the piezoelectric device 530 when the thermal stress is generated.

To this end, the temperature sensing unit 540 includes a conversion table (not illustrated) in which temperatures respectively matched with a plurality of voltage values are stored, and may sense a temperature of the power device 520 using the conversion table.

That is, the temperature sensing unit 540 may calculate voltage values of voltage signals generated from the piezoelectric devices 530 disposed in opposition to each other with respect to the substrate 510 or a difference between the voltage values and search a value corresponding to the calculated voltage value difference from the conversion table and acquire a temperature value matched therewith and thus sense a temperature of the power device 520.

Meanwhile, if the piezoelectric device 530 operates as the actuator, the piezoelectric device 530 may receive an electrical signal having an opposite polarity to that of an electric signal generated when the thermal stress is generated through the electrode 532 and then reduce the thermal stress generated on the substrate 510.

To this end, the electrode 532 may be formed on an upper surface and a lower surface of the piezoelectric device 530. In the present exemplary embodiment, the electrode 532 formed on the upper surface of the piezoelectric device 530 is referred to as the upper electrode 532 and the electrode 532 formed on the lower surface thereof is referred to as the lower electrode 532.

Herein, although the lower electrode 532 may be formed as a separate electrode, the lower electrode 532 is formed as the upper metal layer of the power substrate 510 in the present exemplary embodiment. Therefore, in the piezoelectric device 530, the upper metal layer may receive the electrical signal from the outside instead of the lower electrode 532.

Meanwhile, the electrode 532 may be disposed on both ends of the piezoelectric device 530 in a longitudinal direction thereof.

For example, if the piezoelectric devices 530 are disposed as spaced in all directions from the power device 520, the electrode 532 may be disposed on both ends of a first piezoelectric device disposed in opposition thereto in one direction among the piezoelectric devices 530 and the upper electrode 532 and the lower electrode 532 may be disposed on an upper surface and a lower surface, respectively, of a second piezoelectric device disposed in the other direction intersecting with the one direction.

For reference, in an exemplary embodiment of the present disclosure, two sets including the first piezoelectric device and the second piezoelectric device intersecting with each other are formed on the upper surface of the substrate 510 as illustrated in the drawing.

Meanwhile, the power supply unit 550 may supply the electrical signal to the electrode 532.

If the thermal stress is generated on the substrate 510, the power supply unit 550 may supply the electrode 532 with an electrical signal having an opposite polarity to that of an electric signal generated by the generation of the thermal stress.

Thus, a stress generated by the generation of the thermal stress in an opposite direction to a bending direction of the substrate 510 is applied to the substrate 510. Therefore, according to an exemplary embodiment of the present disclosure, a bent portion of the substrate 510 is restored to its original state (or close to it), and, thus, the thermal stress generated on the substrate 510 can be reduced.

For example, if a part of the substrate 510 is deformed to be extended when the thermal stress is generated, the piezoelectric device 530 may generate an electrical signal having a voltage level corresponding to the deformed portion. In this case, the power supply unit 550 supplies the piezoelectric device 530 with an electrical signal having an identical voltage and an opposite polarity to that of the generated electrical signal, and, thus, a tensile stress on the deformed portion is converted to a compressive stress to offset the thermal stress generated on the substrate 510.

In contrast, if a part of the substrate 510 is deformed to be contracted when the thermal stress is generated, the piezoelectric device 530 may generate an electrical signal having a voltage level corresponding to the deformed portion. In this case, the power supply unit 550 supplies the piezoelectric device 530 with an electrical signal having an identical voltage and an opposite polarity to that of the generated electrical signal, and, thus, a compressive stress on the deformed portion is converted to a tensile stress to offset the thermal stress generated on the substrate 510.

Hereinafter, a function of the piezoelectric device 530 as an actuator will be described in detail with reference to FIG. 6.

As illustrated in FIG. 6, the substrate 510 is bent by heat generation of the power device 520.

Therefore, the piezoelectric device 530 may also be bent and may generate an electrical signal depending on the degree of bending.

Meanwhile, the electrode 532 may be disposed on both ends of the piezoelectric device 530, or may be disposed on each of the upper surface and the lower surface, respectively, of the piezoelectric device 530. In this case, the electrode 532 may be formed on the piezoelectric device 530 as part of a poling process. Therefore, when the piezoelectric device 530 is deformed, positive (+) and negative (−) polarization occurs, and, thus, the piezoelectric device 530 may generate an electrical signal having a polarity through each electrode 532.

Therefore, the power supply unit 550 may supply an electrical signal having an opposite polarity to that of the electrical signal generated by the piezoelectric device 530, and the piezoelectric device 530 may receive the supplied electrical signal through the electrode 532 to reduce (offset) the thermal stress on the substrate 510.

For example, as illustrated in FIG. 6, if both ends of the substrate 510 are deformed to be extended downwards when the power device 520 generates heat, the piezoelectric device 530 may generate a tensile stress while being bent together with the substrate 510.

Then, the power supply unit 550 may supply the electrode 532 with an electrical signal having an opposite polarity to that of an electrical signal generated when the tensile stress is generated.

Thus, the piezoelectric device 530 may generate a compressive stress to offset deformation of the substrate 510 caused by the tensile stress.

As such, according to an exemplary embodiment of the present disclosure, the piezoelectric device 530 operates as not only a temperature sensor but also an actuator and thus attenuates a stress in a portion of the substrate 510 where the thermal stress is concentrated. Thus, it is possible to reduce thermal deformation of the substrate 510 and also possible to suppress thermal damage to the substrate 510.

Figure 7:
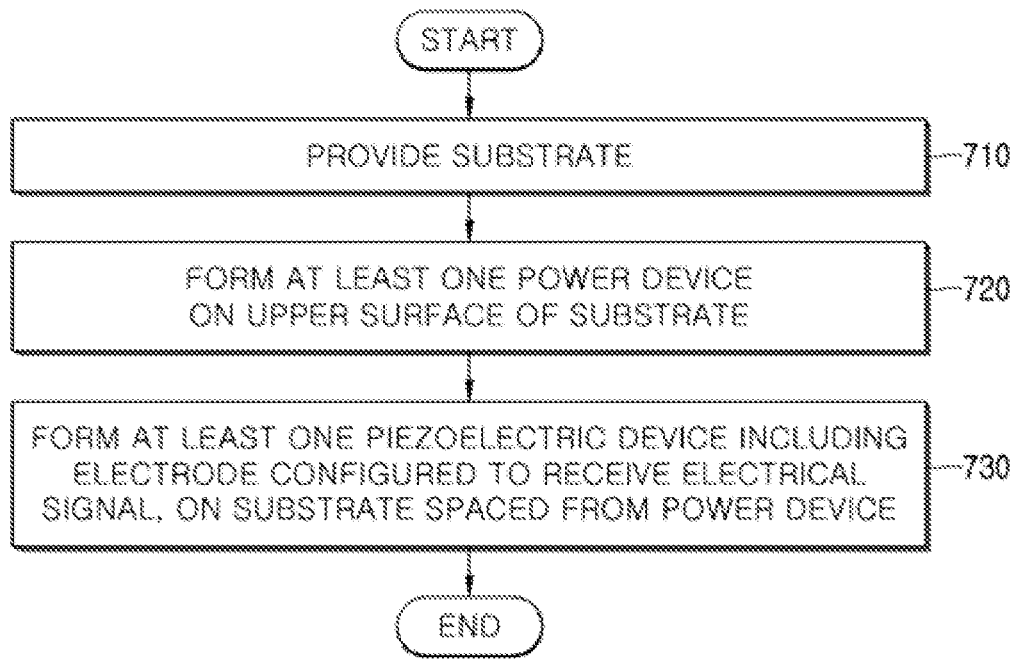
FIG. 7 is a flowchart provided to explain a method for manufacturing the apparatus for reducing a thermal stress of a power device using a piezoelectric device according to an exemplary embodiment of the present disclosure.

FIG. 7 is a flowchart provided to explain a method for manufacturing the apparatus for reducing a thermal stress of a power device using a piezoelectric device according to an exemplary embodiment of the present disclosure, and FIG. 8 to FIG. 12 are manufacturing process diagrams of the apparatus for reducing a thermal stress of a power device using a piezoelectric device according to an exemplary embodiment of the present disclosure.

Figure 8:
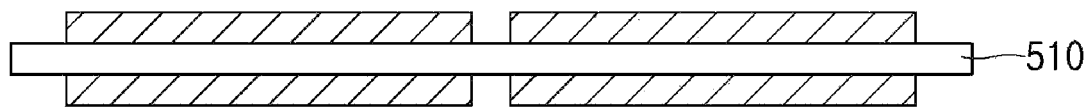
FIG. 8 to FIG. 12 are manufacturing process diagrams of the apparatus for reducing a thermal stress of a power device using a piezoelectric device according to an exemplary embodiment of the present disclosure.

Firstly, referring to FIG. 7 and FIG. 8, the substrate 510 is provided in a process 710.

Herein, the substrate 510 includes the upper metal layer and the lower metal layer on its upper surface and lower surface and thus can effectively receive heat generated from the power device 520.

Figure 9:
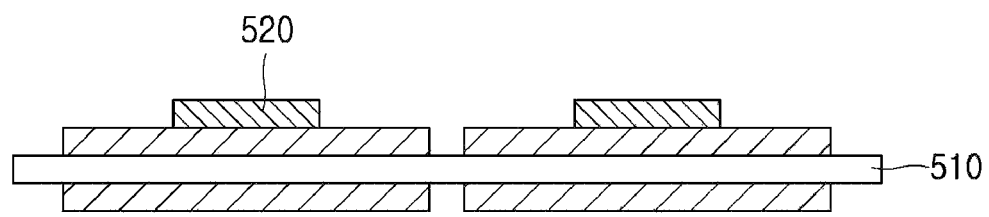

Then, referring to FIG. 7 and FIG. 9, at least one power device 520 is formed on the upper surface of the substrate 510 in a process 720.

In the present exemplary embodiment, the power device 520 formed on the uppers surface of the substrate 510 will be described as plural in number as illustrated in FIG. 9.

Figure 10:
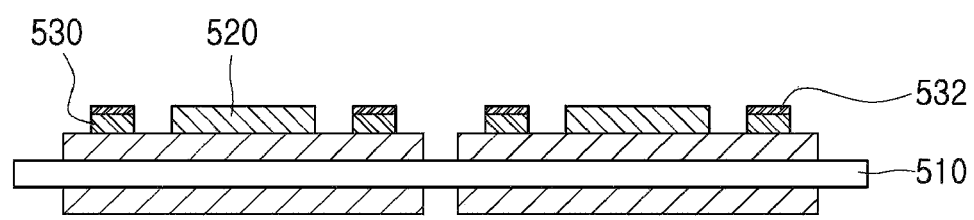

Then, referring to FIG. 7 and FIG. 10, at least one piezoelectric device 530 including the electrode 532 configured to receive an electrical signal from the outside is formed on the substrate 510 spaced from the power devices 520 in a process 730.

Herein, the piezoelectric device 530 receives the electrical signal through the electrode 532 and thus can reduce a thermal stress generated when the power devices 520 generate heat.

In this case, the piezoelectric device 530 may operate as a sensor configured to measure a thermal stress generated on the substrate 510 and generate an electrical signal corresponding thereto, or may operate as an actuator configured to receive the electrical signal through the electrode 532 to reduce the thermal stress.

If the piezoelectric device 530 is supplied through the electrode 532 with an electrical signal having an opposite polarity to that of an electrical signal generated when the piezoelectric device 530 operates as the sensor, the piezoelectric device 530 may operate as the actuator.

Figure 11:
Figure 12:
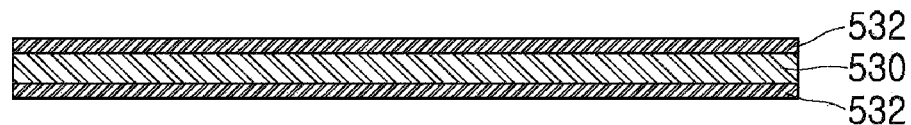

To this end, the electrode 532 may be formed on both ends of the piezoelectric device 530 through a poling process as illustrated in FIG. 11, or may be formed on the upper surface and the lower surface of the piezoelectric device 530 through the poling process as illustrated in FIG. 12.

If the electrode 532 is formed through the poling process, polarization occurs in the piezoelectric device 530, and, thus, the piezoelectric device 530 operates as the sensor to generate an electrical signal having a polarity through each electrode 532. Therefore, according to an exemplary embodiment of the present disclosure, it is possible to measure a temperature of the power device 520 using an electrical signal generated when the piezoelectric device 530 operates as a sensor.

Further, when the piezoelectric device 530 operates as the actuator, the piezoelectric device 530 may be supplied through each electrode 532 with an electrical signal having an opposite polarity to that of an electrical signal generated when the piezoelectric device 530 operates as the sensor and thus may reduce a thermal stress on the substrate 510. Therefore, according to an exemplary embodiment of the present disclosure, it is possible to reduce thermal deformation of the substrate 510 and thus suppress thermal damage to the substrate 510.

Meanwhile, if the piezoelectric device 530 is formed to have a structure as illustrated in FIG. 12, the lower electrode 532 formed on its lower surface may be substituted by the upper metal layer of the substrate 510. Therefore, according to an exemplary embodiment of the present disclosure, it is not necessary to separately form the lower electrode 532 of the piezoelectric device 530. Thus, the process can be simplified and the processing cost and time can be reduced.

As such, according to an exemplary embodiment of the present disclosure, the piezoelectric device 530 which can operate as both a sensor and an actuator is integrated on the substrate 510. Thus, it is possible to measure a temperature of the power device 520 with a minimum change in design and also possible to reduce a thermal stress generated on the substrate 510.

Meanwhile, the embodiments have been described specifically in the detailed description of the invention. However, it is obvious that various modifications can be made without departing from the scope of the present disclosure. Therefore, the scope of the present disclosure is not limited to the embodiments described above but should be defined by the following claims and equivalents thereof.

Although the present disclosure has been described by limited exemplary embodiments and drawings in the exemplary embodiment of the present disclosure as described above, the present disclosure is not limited to the exemplary embodiment. Various modifications and changes can be made by a person having ordinary skill in the art from the descriptions above. Therefore, the spirit of the present disclosure is defined only by the appended claims, and encompasses all modifications and equivalents that fall within the scope of the appended claims.

What is claimed is:

1. An apparatus for measuring a temperature of a power device using a piezoelectric device, the apparatus comprising:
    a substrate;
    at least one power device formed on one surface of the substrate; and
    at least one piezoelectric device disposed on the substrate spaced from the power device and configured to measure a thermal stress generated on the substrate to sense a temperature caused by heat generation of the power device.

2. The apparatus for measuring a temperature of a power device using a piezoelectric device of claim 1, wherein the at least one piezoelectric device is disposed as spaced in up and down and left and right directions from the at least one power device.

3. The apparatus for measuring a temperature of a power device using a piezoelectric device of claim 2, wherein if the at least one power device is plural in number, the at least one piezoelectric device is disposed between the power devices.

4. The apparatus for measuring a temperature of a power device using a piezoelectric device of claim 2, wherein if the at least one power device is plural in number, the at least one piezoelectric device is disposed as spaced in the up and down and left and right directions from the power devices except between the power devices.

5. The apparatus for measuring a temperature of a power device using a piezoelectric device of claim 4, wherein among the at least one piezoelectric device, a piezoelectric device disposed at a position intersecting with a layout direction of the power devices has a length which is set on the basis of a length of each of the power devices and a separation distance between the power devices.

6. The apparatus for measuring a temperature of a power device using a piezoelectric device of claim 1, wherein the piezoelectric device is formed on one surface and the other surface of the substrate and disposed in opposition to each other with respect to the substrate.

7. The apparatus for measuring a temperature of a power device using a piezoelectric device of claim 1, the apparatus further comprising:
    a temperature sensing unit configured to sense a temperature of the power device on the basis of a voltage value of a voltage signal generated from the at least one piezoelectric device by the thermal stress.

8. The apparatus for measuring a temperature of a power device using a piezoelectric device of claim 7, wherein the temperature sensing unit senses a temperature of the power device in consideration of noise included in the voltage signal.

9. The apparatus for measuring a temperature of a power device using a piezoelectric device of claim 7, wherein if the voltage signals are different in polarity, the temperature sensing unit senses a temperature of the power device on the basis of a difference between voltage values of the voltage signals different from each other in polarity.

10. The apparatus for measuring a temperature of a power device using a piezoelectric device of claim 7, wherein if the at least one piezoelectric device is disposed as spaced in up and down and left and right directions from the power devices except between the power devices, the temperature sensing unit senses a temperature of the power device on the basis of the sum of voltage values of voltage signals generated from a piezoelectric device disposed as spaced in at least one of the up and down or left and right directions from the power devices.

11. An apparatus for reducing a thermal stress of a power device using a piezoelectric device, the apparatus comprising:
    a substrate;
    at least one power device formed on an upper surface of the substrate; and
    at least one piezoelectric device disposed on the substrate spaced from the power device and including an electrode configured to receive an electrical signal from the outside to reduce a thermal stress generated on the substrate by heat generation of the power device.

12. The apparatus for reducing a thermal stress of a power device using a piezoelectric device of claim 11, wherein the piezoelectric device operates as at least one of a sensor configured to measure the thermal stress generated on the substrate to sense a temperature caused by heat generation of the power device or an actuator configured to receive the electrical signal through the electrode to reduce the thermal stress.

13. The apparatus for reducing a thermal stress of a power device using a piezoelectric device of claim 11, wherein the piezoelectric device receives an electrical signal having an opposite polarity to that of an electric signal generated when the thermal stress is generated through the electrode and thus reduces the thermal stress generated on the substrate.

14. The apparatus for reducing a thermal stress of a power device using a piezoelectric device of claim 11, wherein the electrode includes:
   an upper electrode formed on an upper surface of the piezoelectric device; and
   a lower electrode formed on a lower surface of the piezoelectric device.

15. The apparatus for reducing a thermal stress of a power device using a piezoelectric device of claim 14, wherein the substrate is a power substrate including an upper metal layer and a lower metal layer on an upper surface and a lower surface, respectively, of an insulator, and
   the lower electrode is the upper metal layer of the power substrate.

16. The apparatus for reducing a thermal stress of a power device using a piezoelectric device of claim 11, wherein the electrode is disposed on both ends of the piezoelectric device in a longitudinal direction.

17. The apparatus for reducing a thermal stress of a power device using a piezoelectric device of claim 16, wherein if the piezoelectric device is disposed as spaced in all directions from the power device, the electrode is disposed at both ends of a first piezoelectric device disposed in opposition thereto in one direction among the piezoelectric devices and an upper electrode and a lower electrode are disposed on an upper surface and a lower surface, respectively, of a second piezoelectric device disposed in the other direction intersecting with the one direction.

18. The apparatus for reducing a thermal stress of a power device using a piezoelectric device of claim 11, the apparatus further comprising:
   a power supply unit configured to supply the electrical signal to the electrode,
   wherein if the thermal stress is generated on the substrate, the power supply unit supplies the electrode with an electrical signal having an opposite polarity to that of an electric signal generated when the thermal stress is generated.

19. The apparatus for reducing a thermal stress of a power device using a piezoelectric device of claim 11, wherein the piezoelectric device is disposed as spaced in all directions from the power device.

20. The apparatus for reducing a thermal stress of a power device using a piezoelectric device of claim 11, the apparatus further comprising:
   a temperature sensing unit configured to sense a temperature of the power device on the basis of an electrical signal generated from the piezoelectric device when the thermal stress is generated.

21. A method for manufacturing an apparatus for reducing a thermal stress of a power device using a piezoelectric device, the method comprising:
   providing a substrate;
   forming at least one power device on an upper surface of the substrate; and
   forming at least one piezoelectric device including an electrode configured to receive an electrical signal from the outside to reduce a thermal stress generated on the substrate by heat generation of the power device, on the substrate spaced from the power device,
   wherein the forming of at least one piezoelectric device includes forming an upper electrode and a lower electrode on an upper surface and a lower surface, respectively, of the piezoelectric device through a poling process.

22. The method for manufacturing an apparatus for reducing a thermal stress of a power device using a piezoelectric device of claim 21, wherein the providing of the substrate includes providing a power substrate including an upper metal layer and a lower metal layer on an upper surface and a lower surface, respectively, of an insulator, and
   the lower electrode is the upper metal layer of the power substrate.

* * * * *